(12) United States Patent
Tschumakow

(10) Patent No.: US 10,468,497 B2
(45) Date of Patent: Nov. 5, 2019

(54) METHOD FOR MANUFACTURING A BIPOLAR JUNCTION TRANSISTOR

(71) Applicant: Infineon Technologies Dresden GmbH, Dresden (DE)

(72) Inventor: Dmitri Alex Tschumakow, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 15/678,152

(22) Filed: Aug. 16, 2017

(65) Prior Publication Data

US 2018/0061961 A1 Mar. 1, 2018

(30) Foreign Application Priority Data

Aug. 26, 2016 (DE) .................. 10 2016 216 084

(51) Int. Cl.

| *H01L 29/66* | (2006.01) |
|---|---|
| *H01L 29/732* | (2006.01) |
| *H01L 29/06* | (2006.01) |
| *H01L 29/10* | (2006.01) |
| *H01L 29/737* | (2006.01) |

(Continued)

(52) U.S. Cl.
CPC .... *H01L 29/66242* (2013.01); *H01L 29/0649* (2013.01); *H01L 29/0653* (2013.01); *H01L 29/1004* (2013.01); *H01L 29/66265* (2013.01); *H01L 29/732* (2013.01); *H01L 29/7317* (2013.01); *H01L 29/7371* (2013.01); *H01L 23/66* (2013.01)

(58) Field of Classification Search
CPC .......... H01L 29/66242; H01L 29/0649; H01L 29/0653; H01L 29/1004; H01L 29/66265; H01L 29/7317; H01L 29/732; H01L 29/7371; H01L 23/66

See application file for complete search history.

(56) References Cited

U.S. PATENT DOCUMENTS

| 5,326,718 A * | 7/1994 | Klose ................ H01L 29/66287 |
|---|---|---|
| | | 257/E21.131 |
| 6,680,522 B1 * | 1/2004 | Sato .................. H01L 29/66242 |
| | | 257/587 |

(Continued)

FOREIGN PATENT DOCUMENTS

| DE | 10005442 | 8/2001 |
|---|---|---|
| DE | 10038955 | 2/2002 |
| WO | WO 2009/158054 | 12/2009 |

*Primary Examiner* — Feifei Yeung Lopez
(74) *Attorney, Agent, or Firm* — Harrity & Harrity, LLP

(57) ABSTRACT

Embodiments provide a method for manufacturing a bipolar junction transistor. The method comprises a step of providing a layer stack, the layer stack comprising a semiconductor substrate having a trench isolation, a base contact layer stack, wherein the base contact layer stack comprises a recess forming an emitter window, lateral spacers arranged on sidewalls of the emitter window, the lateral spacers isolating a base contact layer of the base contact layer stack; and a base layer arranged in the emitter window on the semiconductor substrate, wherein the base layer at least partially protrudes under the lateral spacers. The method further comprises a step of providing an isolation layer on the base layer.

25 Claims, 7 Drawing Sheets

(51) Int. Cl.
  *H01L 29/73* (2006.01)
  *H01L 23/66* (2006.01)

(56) References Cited

U.S. PATENT DOCUMENTS

2003/0020139 A1    1/2003  Stengl et al.
2004/0256613 A1*  12/2004  Oda ................ H01L 21/823807
                                                   257/19

* cited by examiner

FIG 1

10 providing a layer stack, the layer stack comprising:
- a semiconductor substrate having a trench isolation;
- a base contact layer stack, wherein the base contact layer stack comprises a recess forming an emitter window;
- lateral spacers arranged on sidewalls of the emitter window, the lateral spacers isolating a base contact layer of the base contact layer stack; and
- a base layer arranged in the emitter window on the semiconductor substrate, wherein the base layer at least partially protrudes under the lateral spacers;

12 providing an isolation layer on the base layer and on the lateral spacers, wherein a portion of the isolation layer covering the base layer is thicker than a portion of the isolation layer covering the lateral spacers.

14

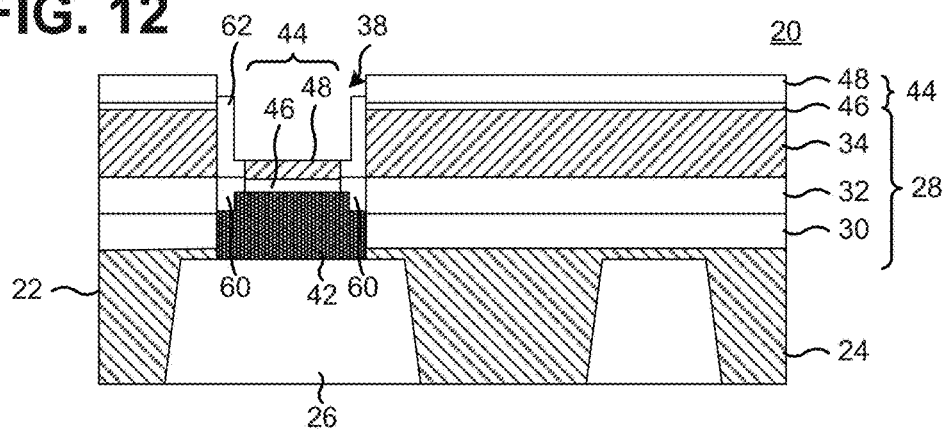
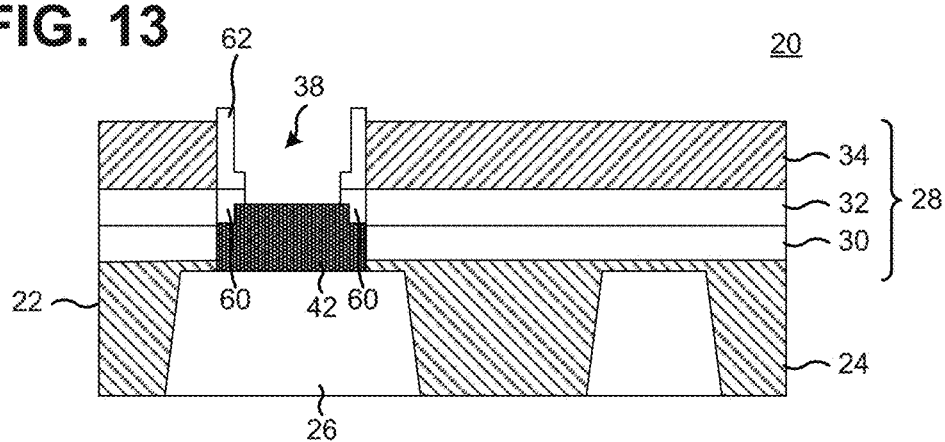
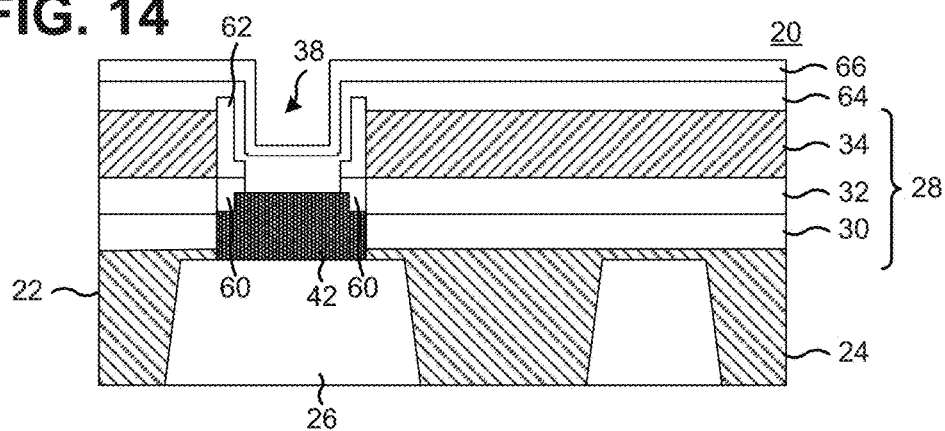

ued STATES PATENT

METHOD FOR MANUFACTURING A BIPOLAR JUNCTION TRANSISTOR

RELATED APPLICATION

This application claims priority under 35 U.S.C. § 119 to German Patent Application No. 102016216084.2, filed on Aug. 26, 2016, the content of which is incorporated by reference herein in its entirety.

TECHNICAL FIELD

Embodiments relate to a method for manufacturing a bipolar junction transistor. Further embodiments relate to bipolar junction transistor. Further embodiments relate to HBT with emitter window fully self-aligned to a pre-structured base electrode with single crystal base link realized by a controlled cavity filling that enables minimal parasitics and scalability below lithographic limits.

BACKGROUND

Bipolar junction transistors are used in many applications, such as signal generators in car RADAR (RAdio Detection And Ranging) or similar microwave applications, requiring high switching frequencies. To improve the figure of merit maximum switching frequency (fmax), it is important to reduce the amount of parasitic resistances and capacitances as well as keeping the base width of the transistor at the minimum value possible. At the same time, manufacturing costs should be kept low.

SUMMARY

Embodiments provide a method for manufacturing a bipolar junction transistor. The method comprises a step of providing a layer stack, the layer stack comprising a semiconductor substrate having a trench isolation, a base contact layer stack, wherein the base contact layer stack comprises a recess forming an emitter window, lateral spacers arranged on sidewalls of the emitter window, the lateral spacers isolating a base contact layer of the base contact layer stack; and a base layer arranged in the emitter window on the semiconductor substrate, wherein the base layer at least partially protrudes under the lateral spacers. The method further comprises a step of providing an isolation layer on the base layer.

Further embodiments provide a bipolar junction transistor. The Bipolar junction transistor comprises a semiconductor substrate having a trench isolation; a second isolation layer arranged on the semiconductor substrate, wherein the second isolation layer comprises a recess; a base layer arranged on the semiconductor substrate in the recess of the second isolation layer; a base electrode layer arranged on the second isolation layer; a base link connecting the base layer and the base electrode layer, wherein the base link is formed such that in a cross-sectional view of the bipolar junction transistor a material intersection between the base layer and the structured base electrode is inclined with respect to a surface of the semiconductor substrate; and an emitter layer arranged on the base layer.

BRIEF DESCRIPTION OF THE DRAWINGS

FIG. 1 shows a flowchart of a method for manufacturing a bipolar junction transistor, according to an embodiment;

FIG. 12 shows a schematic cross sectional view of the heterojunction bipolar transistor during manufacturing after the step of selectively removing the protective layer to expose the isolation layer covering the base layer while maintaining an L-shaped part of the protective layer covering sidewalls of the emitter window and the base link;

FIG. 13 shows a schematic cross sectional view of the heterojunction bipolar transistor during manufacturing after the step of selectively removing the isolation layer t to expose the base layer;

FIG. 14 shows a schematic cross sectional view of the heterojunction bipolar transistor during manufacturing after the step of providing a fourth isolation layer on the base layer and the L-shaped parts of the protective layer and providing a second protective layer on the second isolation layer;

DETAILED DESCRIPTION

Figure 2:
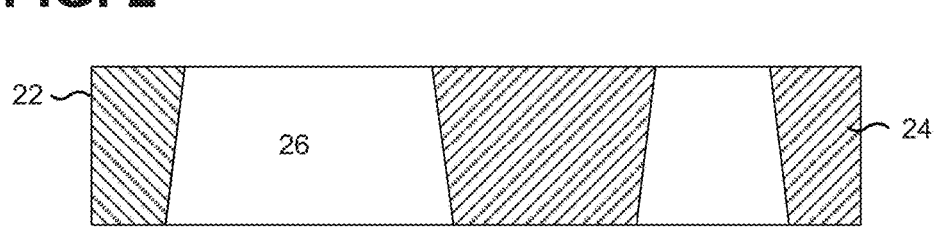
FIG. 2 shows a schematic cross-sectional view of the heterojunction bipolar transistor during manufacturing after the step of providing a semiconductor substrate.

Below, embodiments of the present invention will subsequently be discussed referring to the enclosed figures, wherein identical reference numerals are provided to objects or elements having the same or similar function so that the description thereof is mutually applicable and interchangeable.

FIG. 1 shows a flowchart of a method 10 for manufacturing a bipolar junction transistor. The method 10 comprises a step 12 of providing a layer stack, the layer stack comprises a semiconductor substrate having a trench isolation, a base contact layer stack (or base electrode layer stack), wherein the base contact layer stack comprises a recess forming an emitter window, lateral spacers arranged on sidewalls of the emitter window, the lateral spacers isolating a base contact layer (or base electrode layer) of the base contact layer stack, and a base layer arranged in the emitter window on the semiconductor substrate, wherein the base layer at least partially protrudes under the lateral spacers. The method 10 further comprises a step 14 of providing an isolation layer (e.g., first isolation layer) on the base layer and on the lateral spacers, wherein a portion of the isolation layer covering the base layer is thicker than a portion of the isolation layer covering the lateral spacers.

Subsequently, embodiments of the method 10 for manufacturing the bipolar junction transistor are described in which exemplarily a heterojunction bipolar transistor is manufactured making reference to FIGS. 1 to 18 which show cross-sectional views of the heterojunction bipolar transistor after different manufacturing steps.

FIG. 2 shows a schematic cross-sectional view of the heterojunction bipolar transistor 20 during manufacturing after the step of providing a semiconductor substrate 22. The semiconductor substrate (e.g., Si substrate) can comprise a trench isolation (e.g., STI) 24 indicated in the cross sectional view of FIG. 2 by the trench 24. Further, the semiconductor substrate can comprise a collector 26.

Thereby, the STI module 22 can be processed, for example, in a standard way.

Figure 3:
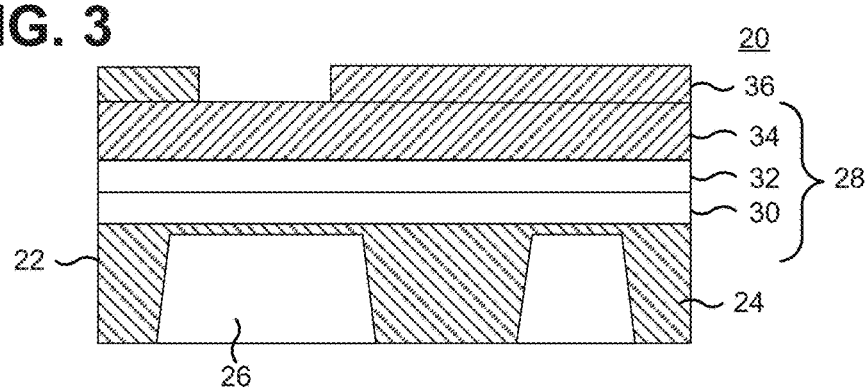
FIG. 3 shows a schematic cross-sectional view of the heterojunction bipolar transistor during manufacturing after the step of providing a base contact layer stack on the semiconductor substrate.

FIG. 3 shows a schematic cross-sectional view of the heterojunction bipolar transistor 20 during manufacturing after the step of providing a base contact layer stack 28 on the semiconductor substrate 22. In detail, the base contact layer stack 28 can comprise a second isolation layer (e.g., oxide) 30 arranged on the semiconductor substrate 22, the base contact layer (e.g., poly Si) 32 arranged on the second isolation layer 30, and a third isolation layer (e.g., oxide) 34 arranged on the base contact layer 32.

For example, as second isolation layer 30 an approximately 20 nm oxide layer can be deposited, as base contact layer approximately 50 nm poly silicon layer (optionally in-situ p-Doped) can be deposited, as third isolation layer an approximately 130 nm oxide layer (this oxide may have a low wet etch rate) can be deposited.

Further, a lithographic mask for emitter window can been applied on the base contact layer stack 28.

Figure 4:
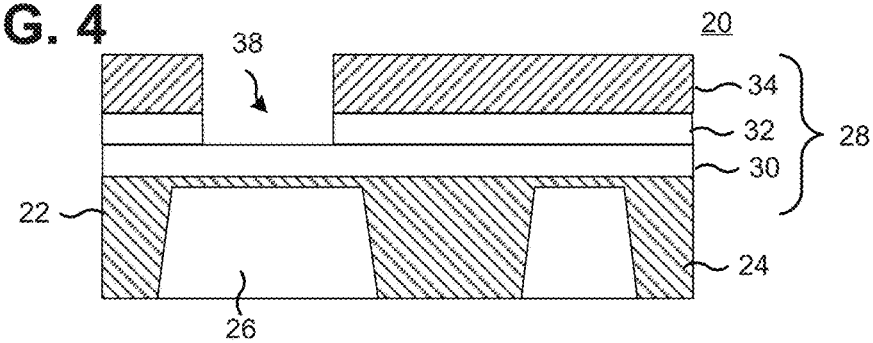
FIG. 4 shows a schematic cross-sectional view of the heterojunction bipolar transistor during manufacturing after the step of selectively removing the third isolation layer and the base contact layer up to the second isolation layer in an area defined by the lithographic mask, to obtain a recess forming an emitter window.

FIG. 4 shows a schematic cross-sectional view of the heterojunction bipolar transistor 20 during manufacturing after the step of selectively removing the third isolation layer 34 and the base contact layer 32 up to the second isolation layer 30 in an area defined by the lithographic mask, to obtain a recess forming an emitter window 38.

For example, the layer stack 28 can be etched down to the second isolation layer (lower oxide) 30 by a sequence of anisotropic etches.

Figure 5:
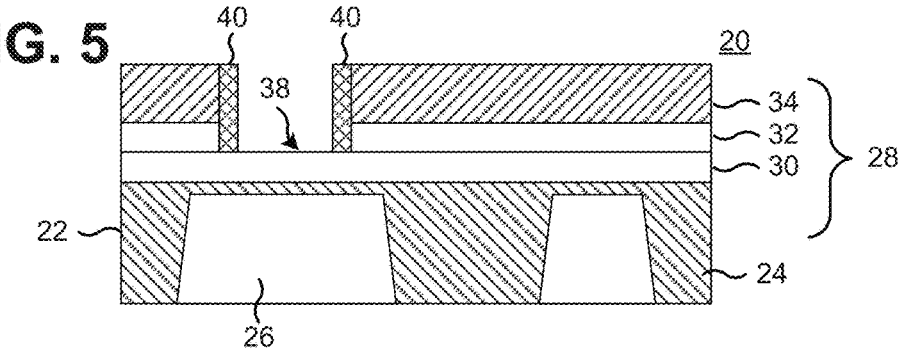
FIG. 5 shows a schematic cross-sectional view of the heterojunction bipolar transistor during manufacturing after the step of providing lateral spacers on sidewalls of the emitter window.

FIG. 5 shows a schematic cross-sectional view of the heterojunction bipolar transistor 20 during manufacturing after the step of providing lateral spacers 40 on sidewalls of the emitter window 38. As shown in FIG. 5, the lateral spacers 40 may laterally isolate the base contact layer 32 of the base contact layer stack 28.

For example, the lateral spacer 40 can be a collector-base vertical spacer, e.g., out of nitride, which can be processed in a standard way, for example, by isotropic deposition and subsequent anisotropic etch.

Figure 6:
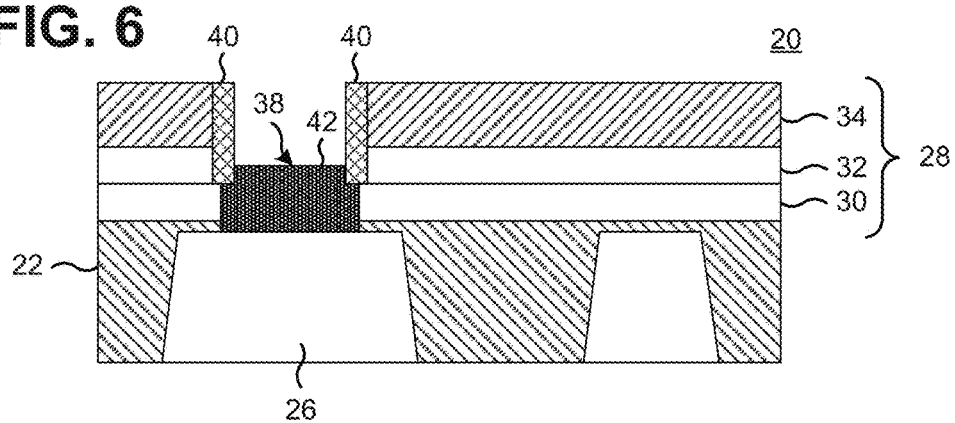
FIG. 6 shows a schematic cross-sectional view of the heterojunction bipolar transistor during manufacturing after the step of selectively removing the second isolation layer at a bottom of the emitter window and providing a base layer in the emitter window such that the base layer is arranged on the semiconductor substrate, wherein the base layer at least partially protrudes under the lateral spacers.

FIG. 6 shows a schematic cross-sectional view of the heterojunction bipolar transistor 20 during manufacturing after the step of selectively removing the second isolation layer at a bottom of the emitter window 38 and providing a base layer 42 in the emitter window 38 such that the base layer 42 is arranged on the semiconductor substrate 22, wherein the base layer 42 at least partially protrudes under the lateral spacers 40.

For example, the second isolation layer (e.g., bottom oxide layer) 30 can be removed by means of a wet etch. Further, the base layer (or base) 42 can be deposited. As indicated in FIG. 6, the wet etch may lead to a certain undercut below the lateral spacer (e.g., nitride spacer) 40. The deposited base layer (or base) 42 may thus have an upside-down-T like shape with rounded corners.

Figure 7:
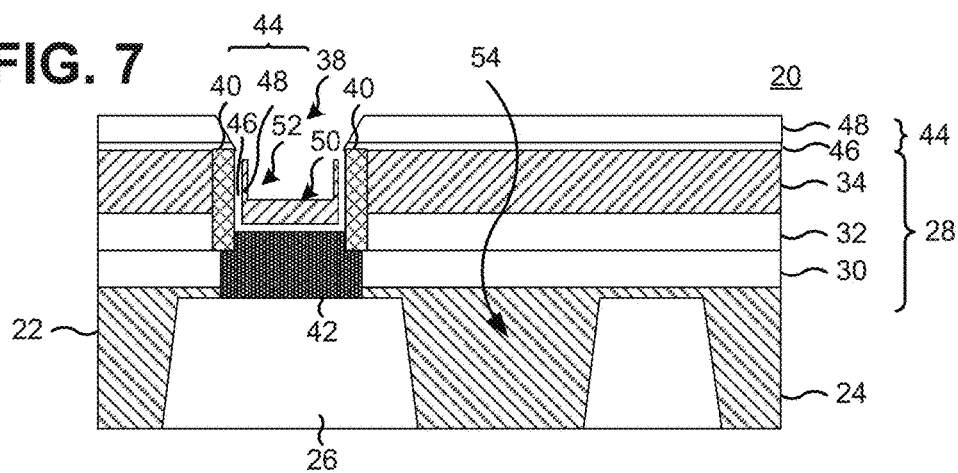
FIG. 7 shows a schematic cross-sectional view of the heterojunction bipolar transistor during manufacturing after the step of providing the isolation layer (first isolation layer) on the base layer and on the lateral spacers.

FIG. 7 shows a schematic cross-sectional view of the heterojunction bipolar transistor 20 during manufacturing after the step of providing the isolation layer (first isolation layer) 44 on the base layer 42 and on the lateral spacers 40.

As shown in FIG. 7, a portion 50 of the isolation layer covering the base layer 42 is thicker than a portion 52 of the isolation layer 44 covering the lateral spacer 40.

In embodiments, the portion 50 of the isolation layer 44 covering the base layer 42 (e.g., the portion 50 of the isolation layer 44 adjacent to or above the base layer 42) can be at least by a factor of two thicker than the portion 52 of the isolation layer 44 covering the lateral spacers 40 (e.g., the portion 52 of the isolation layer 44 adjacent to the lateral spacers 40).

For example, the portion 50 of the isolation layer 44 covering the base layer 42 can be between a factor of two to four (or 2.5 to 3.5; or 2.7 to 3.3) thicker than the portion 52 of the isolation layer 44 covering the lateral spacers 40.

In embodiments, the isolation layer 44 can be deposited with a first deposition rate in a first direction (vertical direction) perpendicular to a surface 54 of the semiconductor substrate 22 and a second deposition rate in a second direction (horizontal direction) parallel to the surface 54 of the semiconductor substrate 22, wherein the first deposition rate is greater than the second deposition rate.

In embodiments, the isolation layer 44 can be provided using two or more different oxide deposition methods. Naturally, the isolation layer 44 also can be provided using only one deposition method.

For example, the isolation layer 44 can be provided using a combination of furnace oxide deposition and high density plasma oxide deposition.

As indicated in FIG. 7, providing the isolation layer can comprise providing a first isolation sub-layer 46 on the base layer 42 and on the lateral spacers 40, and providing a second isolation sub-layer 48 on the first isolation sub-layer 46. Thereby, the second isolation sub-layer 48 can be thicker in an area 50 adjacent to the base layer 42 than in an area 52 adjacent to the lateral spacers 40.

For example, the first isolation sub-layer 46 can be provided using furnace oxide deposition, wherein the second isolation sub-layer 48 can be provided using a high density plasma oxide deposition.

In other words, as shown in FIG. 7, a strongly non-conformal oxide deposition can be performed. The horizontal surfaces (e.g., surface of the base layer 42) can be covered by a layer of a full thickness. The vertical surfaces (e.g., surface of the lateral spacers 40) can be covered by approximately one third of the thickness. A high density plasma (HDP) oxide deposition in combination with a conventional furnace deposition may fulfill this requirement. Additionally, the HDP deposition produces a so-called corner clipping that is of additional merit for the manufacturing of the heterojunction bipolar transistor. Furnace oxide is shown in FIG. 7 as a thin first oxide sub-layer 46. The HDP oxide is shown in FIG. 7 as second oxide sub-layer 48.

Figure 8:
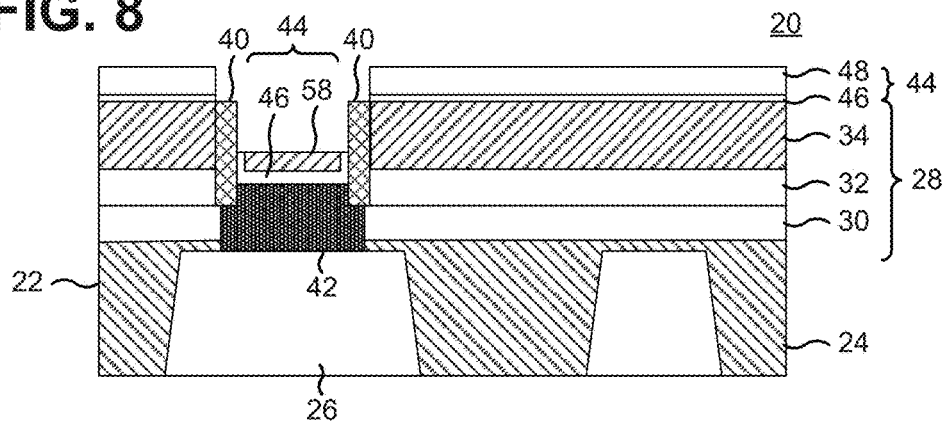
FIG. 8 shows a schematic cross-sectional view of the heterojunction bipolar transistor during manufacturing after the step of selectively removing the isolation layer up to the lateral spacers while partially maintaining (in vertical direction) the thicker portion of the isolation layer covering the base layer, to protect the base layer.

FIG. 8 shows a schematic cross-sectional view of the heterojunction bipolar transistor 20 during manufacturing after the step of selectively removing the isolation layer 44 up to the lateral spacers 40 while partially maintaining (in vertical direction) the thicker portion 50 of the isolation layer 44 covering the base layer 42, to protect the base layer 42.

For example, the side walls of the isolation layer 44 (e.g., deposited oxide) can be removed by a timed wet etch. Thereby, tart of the isolation layer 44 (e.g., oxide) on the horizontal surfaces which was initially thicker remains. This remaining isolation layer 44 (e.g., oxide) may serve as a hard mask that protects the base 42.

Figure 9:
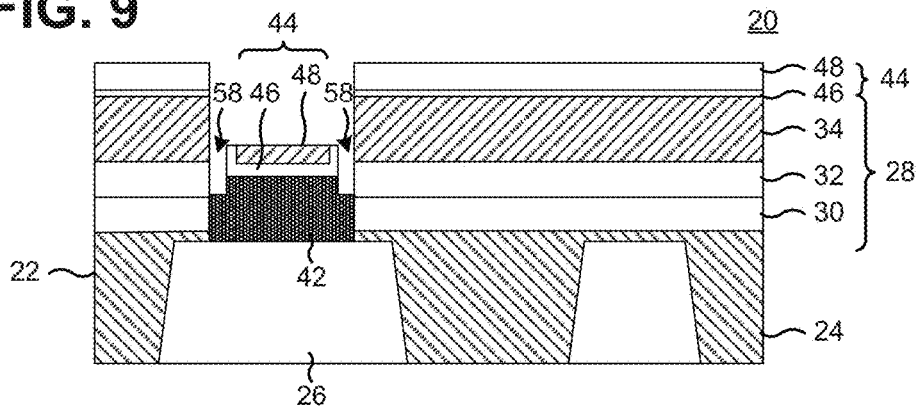
FIG. 9 shows a schematic cross sectional view of the heterojunction bipolar transistor during manufacturing after the step of selectively removing the lateral spacers laterally exposing the base contact layer stack and the part of the base layer protruding under the lateral spacers.

FIG. 9 shows a schematic cross sectional view of the heterojunction bipolar transistor 20 during manufacturing after the step of selectively removing the lateral spacers 40 laterally exposing the base contact layer stack 28 and the part 58 of the base layer 42 protruding under the lateral spacers 40.

For example, the lateral spacer (e.g., nitride spacer) 40 can be removed by wet etching. As a result, only a side wall of the base 42 is opened. The upper part of the base 42 is protected by the isolation layer (e.g., oxide) 44. Also the side surface of the base electrode 32 can be opened. The resulting cavity between the base 42 and electrode 32 side wall can be directly accessed and filled.

Figure 10:
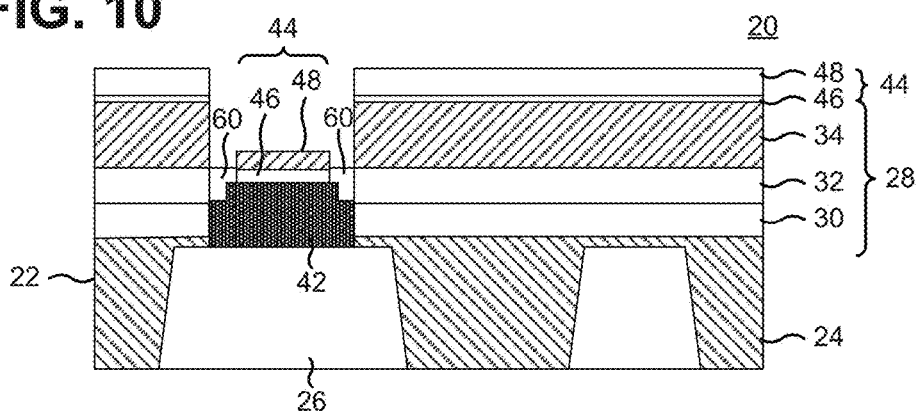
FIG. 10 shows a schematic cross sectional view of the heterojunction bipolar transistor during manufacturing after the step of growing a base link on the exposed part of the base layer, the base link connecting the base layer to a base contact layer of the base contacting layer stack.

FIG. 10 shows a schematic cross sectional view of the heterojunction bipolar transistor 20 during manufacturing after the step of growing a base link 60 on the exposed part 58 of the base layer 42, the base link 60 connecting the base layer 42 to a base contact layer of the base contacting layer stack.

For example, the cavity (in which the part 58 of the base layer 42 previously protruding under the lateral spacers 40 is exposed) can be filled by means of selective p-doped silicon epitaxy resulting in a base link 60. The sides of the base link that point towards the base 42 can be monocrystalline. Additionally, the in-situ dopants may immediately occupy the right lattice positions and may not require an additional anneal. This may help to retain the initial dopant profiles in the intrinsic base 42. Also the cross section of the base 42 and its doped regions are directly connected, enabling an improved (or even best) contact quality. In contrast to known approaches only a short process time is required to fill the cavity. The spacer-based link definition may help to keep the base laterally as tight as possible and thus additionally reduce (or even minimize) the parasitic collector-base capacitance.

Figure 11:
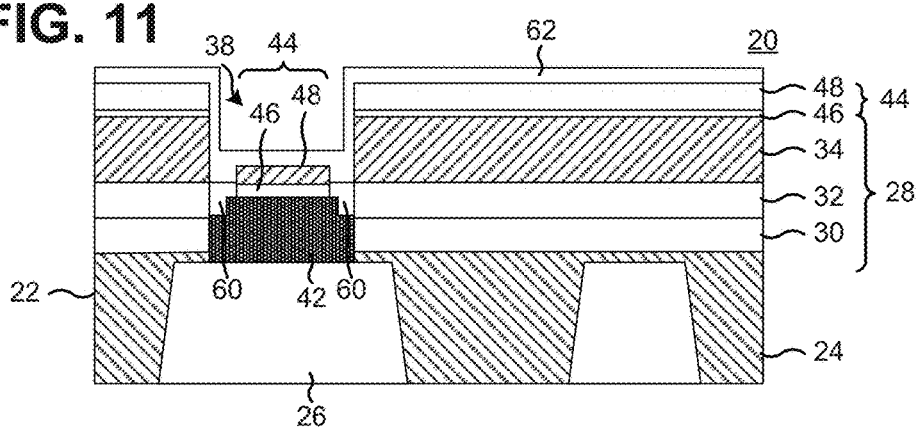
FIG. 11 shows a schematic cross sectional view of the heterojunction bipolar transistor during manufacturing after the step of providing a protective layer on the isolation layer, on the base link and on sidewalls of the emitter window.

FIG. 11 shows a schematic cross sectional view of the heterojunction bipolar transistor 20 during manufacturing after the step of providing a protective layer (e.g., nitride) 62 on the isolation layer 44, on the base link 60 and on sidewalls of the emitter window 38.

For example, a nitride layer 60 can be deposited to protect the side wall of the emitter window 38.

FIG. 12 shows a schematic cross sectional view of the heterojunction bipolar transistor 20 during manufacturing after the step of selectively removing the protective layer 62 to expose the isolation layer 44 covering the base layer 42 while maintaining an L-shaped part of the protective layer 62 covering sidewalls of the emitter window 38 and the base link 60.

For example, an anisotropic spacer etching can be performed and the protective layer 62 (e.g., nitride layer) can be opened at its horizontal surfaces, leaving the vertical nitride spacer.

FIG. 13 shows a schematic cross sectional view of the heterojunction bipolar transistor 20 during manufacturing after the step of selectively removing the isolation layer 44 to expose the base layer 42.

For example, an oxide 44 timed wet etching can be performed. The oxide hard mask 44 at the bottom of the emitter base may disappear. The thicker oxide beside the emitter window 38 may be thinned.

The above described method provides a way to manufacture a hetero junction bipolar transistor with following important features. First, in embodiments the base is grown upon a dedicated collector area, thereby avoiding crystal defects. Second, embodiments provide a strongly reduced (or even minimized) parasitic base-collector capacitance, necessary for high frequency properties. Third, in embodiments, a partially monocrystalline base link is grown into a strictly defined region and directly contacts the dopant peaks in the intrinsic base that does not require an extra anneal and thus helps to retain initial base dopant profiles. Fourth, embodiments provide an inherent shrinkage capability by using of inlaying spacers allowing transistor shrinking below lithography limits. Fifth, embodiments rely on relatively simple unit processes that are available by utilizing their special features.

In embodiments, a base link can be grown after (e.g., a few process steps after) a base deposition by a short, well controlled process.

Embodiments utilize a strongly non-conformal deposition of a dielectric layer to enable the subsequent selective spacer removal, selective base link epitaxy while simultaneously protecting the active area of the base.

Subsequently, an example of how to complete the obtained structure shown in FIG. 13 in order to obtain a finished HBT is described with respect to FIGS. 14 to 18.

FIG. 14 shows a schematic cross sectional view of the heterojunction bipolar transistor 20 during manufacturing after the step of providing a fourth isolation layer 64 on the base layer 42 and the L-shaped parts of the protective layer 62 and providing a second protective layer 66 on the second isolation layer 64.

For example, the oxide and nitride layers 64 and 66 that will later form an L-shaped spacer can be deposited.

Please note that it is also possible that first the second protective layer 66 is provided on the base layer 42 and the L-shaped parts of the protective layer 62 and afterwards the fourth isolation layer 64 is provided on the second protective layer 62.

Figure 15:
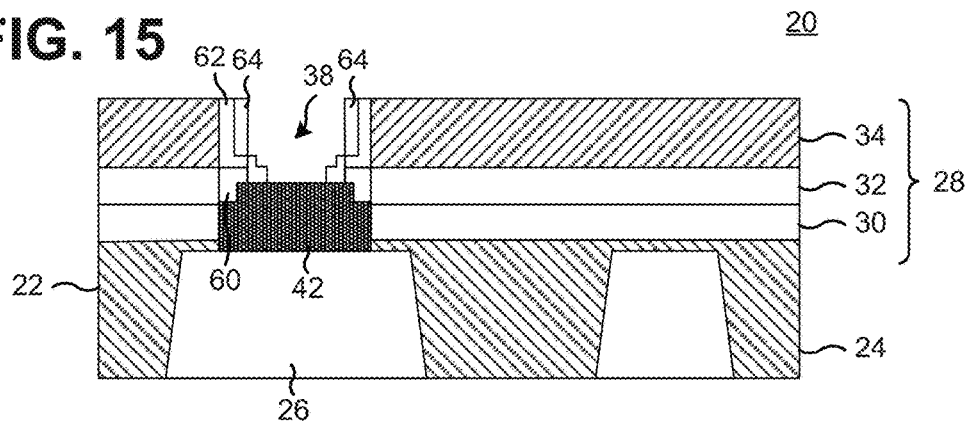
FIG. 15 shows a schematic cross sectional view of the heterojunction bipolar transistor during manufacturing after the step of selectively removing the second protective layer and the fourth isolation layer up to the base layer to expose the base layer while maintaining parts of the fourth isolation layer covering the L-shaped part of the protective layer.

FIG. 15 shows a schematic cross sectional view of the heterojunction bipolar transistor 20 during manufacturing after the step of selectively removing the second protective layer 66 and the fourth isolation layer 62 up to the base layer 42 to expose the base layer 42 while maintaining parts of the fourth isolation layer 62 covering the L-shaped part of the protective layer 62.

For example, a sequential combination of dry nitride etch, wet oxide etch and wet nitride etch may produces an L-Spacer 62. This spacer 62 may separate the base link region 60 from the emitter edges. Thereby, emitter base leakages may be reduced (or even minimized).

Figure 16:
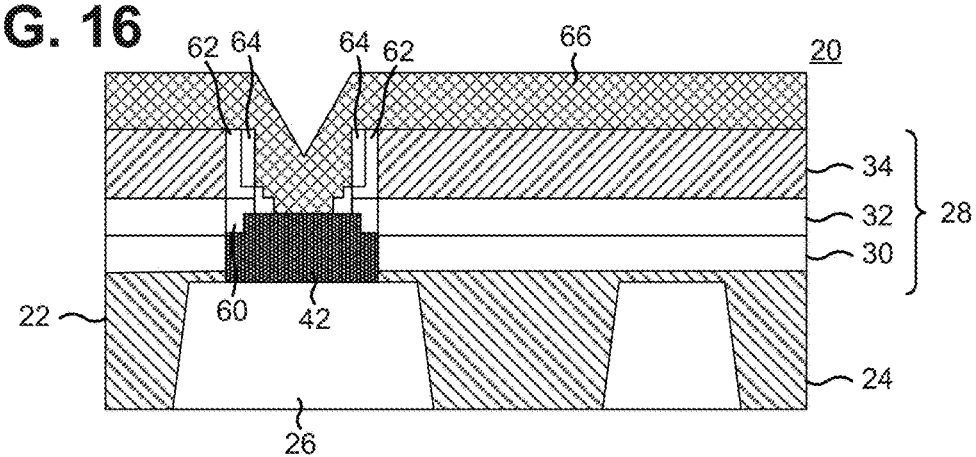
FIG. 16 shows a schematic cross sectional view of the heterojunction bipolar transistor during manufacturing after the step of providing an emitter layer on the base layer.

FIG. 16 shows a schematic cross sectional view of the heterojunction bipolar transistor 20 during manufacturing after the step of providing an emitter layer 66 on the base layer 42.

For example, the emitter layer 66 may be deposited.

Figure 17:
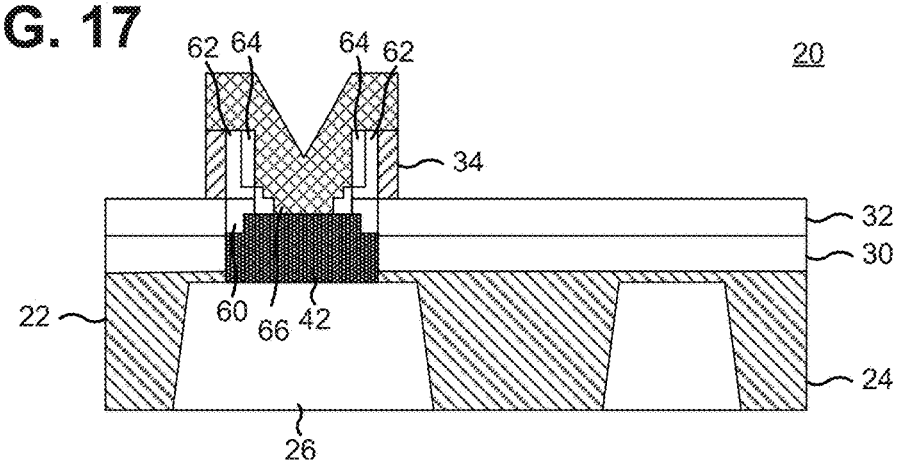
FIG. 17 shows a schematic cross sectional view of the heterojunction bipolar transistor during manufacturing after the step of selectively removing all layers above the base contact layer to expose the base contact layer.

FIG. 17 shows a schematic cross sectional view of the heterojunction bipolar transistor 20 during manufacturing after the step of selectively removing all layers above the base contact layer 32 to expose the base contact layer 32.

For example, the emitter 66 and third isolation layer (e.g., oxide) 34 can be etched by dry anisotropic etches after using a lithography. The oxide etch may stop at the base electrode poly 32.

Figure 18:
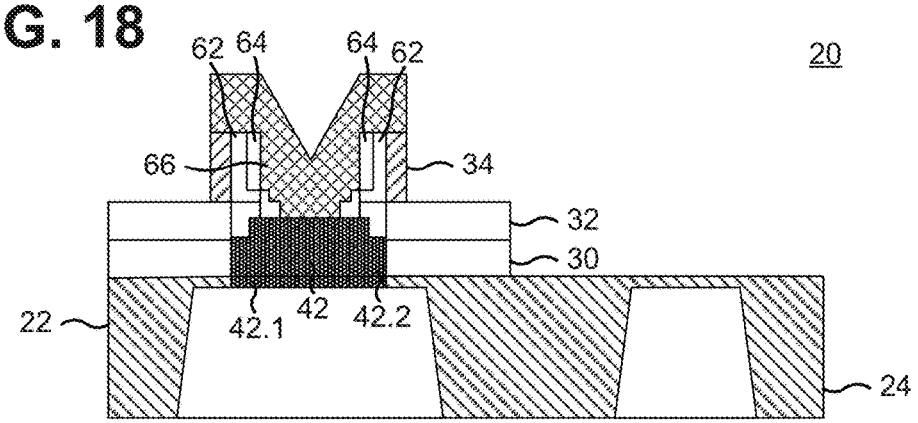
FIG. 18 shows a schematic cross sectional view of the heterojunction bipolar transistor during manufacturing after the step of structuring the base contact layer.

FIG. 18 shows a schematic cross sectional view of the heterojunction bipolar transistor 20 during manufacturing after the step of structuring the base contact layer 32.

For example, the base electrode 32 can be structured at the same manner, and the HBT 20 may be ready.

Referring to FIG. 18, further embodiments provide a bipolar junction transistor 20. The bipolar junction transistor 20 comprises a semiconductor substrate 22 having a trench isolation 24, a second isolation layer 30 arranged on the semiconductor substrate 22, wherein the second isolation layer 30 comprises a recess, a base layer 42 arranged on the semiconductor substrate 22 in the recess of the second isolation layer 30, a structured base electrode layer 32 arranged on the second isolation layer 30, a base link 60 connecting the base layer 42 and the base electrode 32, and an emitter layer 60 arranged on the base layer 42. Thereby, in a cross-sectional view of the bipolar junction transistor a material intersection of the base link between the base layer 42 and the structured base electrode 32 is inclined with respect to a surface of the semiconductor substrate (for more details see FIG. 19).

The inclined material intersection of the base link 60 between the base layer 42 and the structured base electrode 32 is a result of the epitaxial growth of the base link filling the cavity 48 (see FIG. 9) between the base layer 42 and the base electrode layer 32.

For example, as indicated in FIG. 18, the base layer 42 can comprise a first base sub-layer 42_1 arranged on the semiconductor substrate and a second base sub-layer 42_2 arranged on the first base sub-layer 42_1, wherein the first base-sub layer protrudes under the second base sub-layer. Epitaxially growing the base link 60 on such a formed base layer 42 leads to that the material intersection between the base layer 42 and the structured base electrode 32 is inclined with respect to a surface of the semiconductor substrate.

Further, the base link 60 can be monocrystalline at least in a region immediately adjacent to the base layer 42.

The bipolar junction transistor 20 can comprise an L-shaped spacer 62, 64 arranged to separate the base link (region) from the emitter layer 66.

Figure 19:
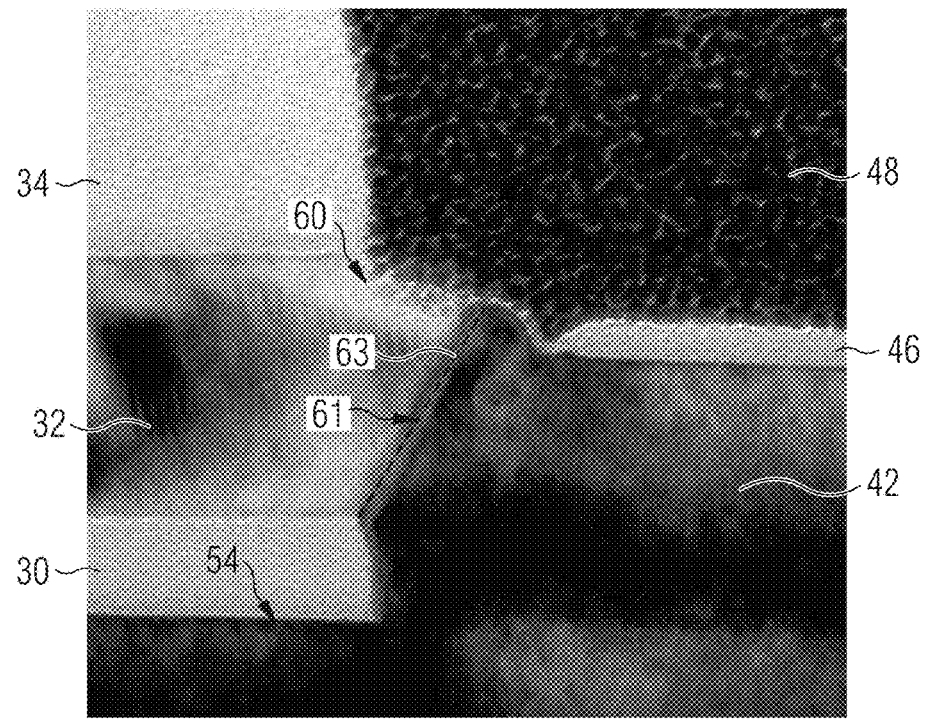
FIG. 19 shows a transmission electron microscopy image of sector of a bipolar junction transistor highlighting a region around a base link.

FIG. 19 shows a transmission electron microscopy image of sector of a bipolar junction transistor highlighting a region around a base link 60. In detail, FIG. 19 shows a transmission electron microscopy image of the bipolar junction transistor after the step of growing the base link on the exposed part of the base layer 42 (compare with FIG. 10).

As shown in FIG. 19, due to the epitaxial growth of the base link 60, a material intersection 61 of the base link between the base layer 42 and the structured base electrode 32 is inclined with respect to a surface 54 of the semiconductor substrate.

The material intersection 61 can be arranged along a line 63 (indicated as dashed line in FIG. 19) that is inclined with respect to a surface 54 of the semiconductor substrate, for example, inclined in an angle between 10° and 80° (or between 20° and 70°, or between 30° and 60°) with respect to the surface of the semiconductor substrate.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A method for manufacturing a bipolar junction transistor, the method comprising:
   providing a layer stack,
      the layer stack comprising:
         a semiconductor substrate having a trench isolation;
         a base contact layer stack,
            the base contact layer stack comprising a recess forming an emitter window;
         lateral spacers arranged on sidewalls of the emitter window,
            the lateral spacers isolating a base contact layer of the base contact layer stack; and
         a base layer arranged in the emitter window on the semiconductor substrate,
            the base layer at least partially protruding under the lateral spacers,
            the base layer being separated from the base contact layer, and
            the lateral spacers being in contact with the base contact layer and the base layer;
   providing an isolation layer on the base layer; and
   selectively removing the isolation layer up to the lateral spacers while partially maintaining a portion of the isolation layer covering the base layer to protect the base layer.

2. The method of claim 1, wherein providing the isolation layer comprises:
   providing the isolation layer on the base layer and on the lateral spacers,
      the portion of the isolation layer covering the base layer being thicker than a portion of the isolation layer covering the lateral spacers.

3. The method of claim 2, wherein the portion of the isolation layer covering the base layer is at least by a factor of two thicker than the portion of the isolation layer covering the lateral spacers.

4. The method of claim 2, wherein the portion of the isolation layer covering the base layer is between a factor of two to four thicker than the portion of the isolation layer covering the lateral spacers.

5. The method of claim 1, wherein providing the isolation layer comprises:
depositing the isolation layer with a first deposition rate in a first direction perpendicular to a surface of the semiconductor substrate and a second deposition rate in a second direction parallel to the surface of the semiconductor substrate,
the first deposition rate being greater than the second deposition rate.

6. The method of claim 1, wherein the isolation layer is provided using at least two different oxide deposition methods.

7. The method of claim 1, wherein the isolation layer is provided using a combination of furnace oxide deposition and high density plasma oxide deposition.

8. The method of claim 1, wherein providing the isolation layer comprises:
providing a first isolation sub-layer on the base layer and on the lateral spacers; and
providing a second isolation sub-layer on the first isolation sub-layer such that the second isolation sub-layer is thicker in an area adjacent to the base layer than in an area adjacent to the lateral spacers.

9. The method of claim 8, wherein the first isolation sub-layer is provided using a furnace oxide deposition.

10. The method of claim 8, wherein the second isolation sub-layer is provided using high density plasma oxide deposition.

11. The method of claim 1, wherein the base contact layer stack comprises a second isolation layer arranged on the semiconductor substrate,
the base contact layer being arranged on the second isolation layer, and
a third isolation layer being arranged on the base contact layer.

12. The method of claim 1, wherein the method further comprises:
completely covering a top of the base layer.

13. The method of claim 1, wherein the method further comprises:
selectively removing the lateral spacers laterally exposing the base contact layer stack and a part of the base layer protruding under the lateral spacers.

14. The method of claim 13, wherein the method further comprises:
growing a base link on an exposed part of the base layer, the base link connecting the base layer to the base contact layer of the base contact layer stack.

15. The method of claim 14, wherein the method further comprises:
providing a protective layer on the isolation layer, on the base link, and on sidewalls of the emitter window; and
selectively removing the protective layer to expose the isolation layer covering the base layer while maintaining an L-shaped part of the protective layer covering the base link and the sidewalls of the emitter window.

16. The method of claim 15, wherein the method further comprises:
selectively removing the isolation layer to expose the base layer.

17. The method of claim 16, wherein the method further comprises:
providing a second isolation layer on the base layer and the L-shaped part of the protective layer;
providing a second protective layer on the second isolation layer; and
selectively removing the second protective layer and the second isolation layer up to the base layer to expose the base layer while maintaining parts of the second isolation layer covering the L-shaped part of the protective layer.

18. The method of claim 1, wherein the method further comprises:
providing an emitter layer on the base layer.

19. The method of claim 18, wherein the method further comprises:
selectively removing layers above the base contact layer to expose the base contact layer; and
structuring the base contact layer.

20. A bipolar junction transistor, comprising:
a layer stack comprising:
a semiconductor substrate having a trench isolation;
a base contact layer stack,
the base contact layer stack comprising a recess forming an emitter window;
lateral spacers arranged on sidewalls of the emitter window,
the lateral spacers isolating a base contact layer of the base contact layer stack; and
a base layer arranged in the emitter window on the semiconductor substrate,
the base layer at least partially protruding under the lateral spacers,
the base layer being separated from the base contact layer, and
the lateral spacers being in contact with the base contact layer and the base layer; and
an isolation layer covering the base layer in between the lateral spacers,
a portion of each of the lateral spacers not being covered by the isolation layer.

21. The bipolar junction transistor of claim 20, wherein the isolation layer covers another portion of each of the lateral spacers, and
wherein a portion of the isolation layer covering the base layer being thicker than portions of the isolation layer covering the lateral spacers.

22. The bipolar junction transistor of claim 21, wherein the portion of the isolation layer covering the base layer is at least by a factor of two thicker than the portions of the isolation layer covering the lateral spacers.

23. The bipolar junction transistor of claim 21, wherein the portion of the isolation layer covering the base layer is between a factor of two to four thicker than the portions of the isolation layer covering the lateral spacers.

24. The bipolar junction transistor of claim 21, wherein the isolation layer comprises:
a first isolation sub-layer on the base layer and on the lateral spacers; and
a second isolation sub-layer on the first isolation sub-layer such that the second isolation sub-layer is thicker in an area adjacent to the base layer than in an area adjacent to the lateral spacers.

25. The method of claim 19, wherein structuring the base contact layer comprises:
removing a portion of the base contact layer.

* * * * *

UNITED STATES PATENT AND TRADEMARK OFFICE
CERTIFICATE OF CORRECTION

PATENT NO.        : 10,468,497 B2
APPLICATION NO.   : 15/678152
DATED             : November 5, 2019
INVENTOR(S)       : Dmitri Alex Tschumakow It is certified that error appears in the above-identified patent and that said Letters Patent is hereby corrected as shown below:

On the Title Page

At (72), "Dmitri Alex Tschumakow, Dresden (DE)" change to -- Dmitri Alex Tschumakow, Dresden (DE); Claus Dahl, Dresden (DE) --

Signed and Sealed this
First Day of June, 2021

Drew Hirshfeld
*Performing the Functions and Duties of the*
*Under Secretary of Commerce for Intellectual Property and*
*Director of the United States Patent and Trademark Office*